United States Patent
Hayashi et al.

(10) Patent No.: US 9,484,503 B2
(45) Date of Patent: Nov. 1, 2016

(54) LIGHT EMITTING DEVICE

(71) Applicant: NICHIA CORPORATION, Anan-shi, Tokushima (JP)

(72) Inventors: Masaki Hayashi, Anan (JP); Yuki Shiota, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/098,975

(22) Filed: Apr. 14, 2016

(65) Prior Publication Data

US 2016/0225961 A1 Aug. 4, 2016

Related U.S. Application Data

(62) Division of application No. 14/247,891, filed on Apr. 8, 2014, now Pat. No. 9,343,643.

(30) Foreign Application Priority Data

Apr. 12, 2013 (JP) ................. 2013-083755

(51) Int. Cl.
| | |
|---|---|
| H01L 29/18 | (2006.01) |
| H01L 33/00 | (2010.01) |
| H01L 33/50 | (2010.01) |
| H01L 33/62 | (2010.01) |
| H01L 25/075 | (2006.01) |
| H01L 33/56 | (2010.01) |
| H01L 33/58 | (2010.01) |

(52) U.S. Cl.
CPC ......... *H01L 33/502* (2013.01); *H01L 25/0753* (2013.01); *H01L 33/56* (2013.01); *H01L 33/58* (2013.01); *H01L 33/62* (2013.01); *H01L 33/50* (2013.01); *H01L 2224/48091* (2013.01); *H01L 2224/48247* (2013.01); *H01L 2224/8592* (2013.01)

(58) Field of Classification Search
CPC ..... H01L 33/502; H01L 33/62; H01L 33/56; H01L 33/58; H01L 25/0753
See application file for complete search history.

(56) References Cited

U.S. PATENT DOCUMENTS

| | | | |
|---|---|---|---|
| 2006/0145340 A1 | 7/2006 | Tseng et al. | |
| 2006/0186431 A1 | 8/2006 | Miki et al. | |
| 2009/0166664 A1 | 7/2009 | Park et al. | |
| 2011/0272716 A1 | 11/2011 | Lee et al. | |

FOREIGN PATENT DOCUMENTS

| | | |
|---|---|---|
| EP | 2023409 A1 | 2/2009 |
| JP | 2007-281218 A | 10/2007 |
| JP | 2009-164583 A | 7/2009 |
| JP | 2011-238928 A | 11/2011 |
| JP | 2012-094689 A | 5/2012 |
| JP | 2012-209377 A | 10/2012 |
| WO | 2007-126074 A1 | 11/2007 |
| WO | 2012-081141 A1 | 6/2012 |

*Primary Examiner* — Stephen W Smoot
*Assistant Examiner* — Vicki B Booker
(74) *Attorney, Agent, or Firm* — Global IP Counselors, LLP

(57) ABSTRACT

A light emitting device includes a first lead, a second lead, an insulating member, a diffusing agent-containing portion, a wavelength conversion portion and a lens portion. The insulating member is configured to fix the first lead and the second lead. A thickness of the insulating member is equal to the thickness of the first and second leads. A groove or a recessed portion is provided to retain the wavelength conversion portion in a specific region formed in the first lead. A second groove portion or recessed portion is formed in a first lead inner side of the groove portion or the recessed portion, which is filled with the diffusing agent-containing portion.

7 Claims, 12 Drawing Sheets

LIGHT EMITTING DEVICE

CROSS-REFERENCE TO RELATED APPLICATIONS

This application is a divisional application of U.S. patent application Ser. No. 14/247,891 (issued as U.S. Pat. No. 9,343,643) filed on Apr. 8, 2014. This application claims priority to Japanese Patent Application No. 2013-083755, filed on Apr. 12, 2013. The entire disclosures of U.S. patent application Ser. No. 14/247,891 and Japanese Patent Application No. 2013-083755 are hereby incorporated herein by reference.

BACKGROUND

1. Technical Field

The present disclosure relates to a light emitting device.

2. Background Art

In recent years, a semiconductor light emitting device has been proposed that mounts a light emitting element on a main surface of a lead frame that is configured as a package exhibiting superior heat dissipating performance. The semiconductor light emitting device is configured to not interpose a material exhibiting high thermal resistance such as an insulating substrate or the like in the heat dissipation channel that radiates heat produced by the light emitting element to the outside.

For example, the light emitting element in a light emitting device configured for a use such as illumination is covered by a sealing member that contains a wavelength conversion material such as a fluorescent material or the like to thereby configure a white light emitting device. More specifically, a thermosetting resin is formed on this type of light emitting device in order to cover the light emitting element and a wire, and thereby configure a light emitting device that is enabled to emit white light by inclusion of a fluorescent material in the sealing resin (JPA 2008-227166).

SUMMARY

A light emitting device has: a first lead which is mounted a light emitting element, a second lead separated by an interval from the first lead, an insulating member configured to fix the first lead and the second lead, a wavelength conversion portion configured to cover the light emitting element, and a lens portion configured to cover the wavelength conversion portion, a thickness of the insulating member is equal to the thickness of the first lead and the second lead, a groove or a recessed portion is provided to retain the wavelength conversion portion in a specific region is formed in the first lead, and a lower surface of the first lead that forms an opposite side of a region formed on the wavelength conversion portion is not covered by the insulating member and is exposed to the outside.

Another light emitting device has: a first lead which is mounted a light emitting element, a second lead separated by an interval from the first lead, an insulating member configured to fix the first lead and the second lead, a diffusing agent-containing portion configured to cover the light emitting element, a wavelength conversion portion configured to cover the diffusing agent-containing portion, and a lens portion configured to cover the wavelength conversion portion, a thickness of the insulating member is equal to the thickness of the first lead and the second lead, a groove or a recessed portion is provided to retain the wavelength conversion portion in a specific region is formed in the first lead, and a lower surface of the first lead that forms an opposite side of a region formed on the wavelength conversion portion is not covered by the insulating member and is exposed to the outside.

DETAILED DESCRIPTION

Figure 1A:
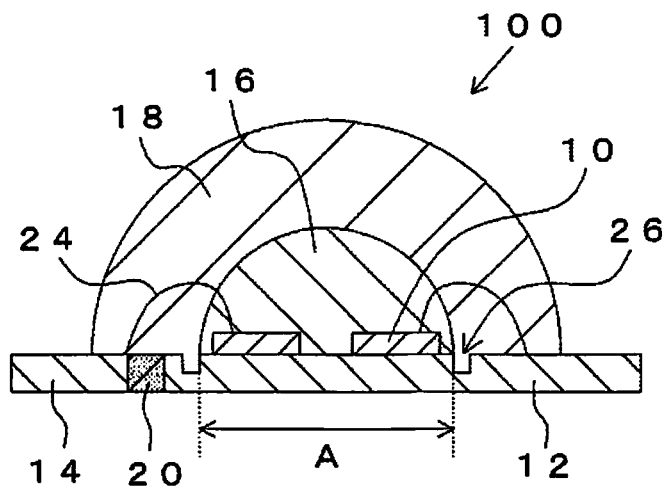
FIG. 1A is a schematic sectional view illustrating a first embodiment of a light emitting device according to the present invention.

Embodiments for implementing the light emitting device of the present invention will be described below with reference to the accompanying drawings. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. Terms indicating a specific direction or position are used as required in the following description (for example, "above", "below", "right", "left", and other terms including those terms). However, these terms are for the purpose of facilitating comprehension of the invention by reference to the figures, and do not limit the technical scope of the invention as a result of the meaning of these terms.

In the present specification, terms such as resin substrate, insulating member and lead are used in relation to the light emitting device after formation into separate units, and terms such as lead frame and resin molded body are used in relation to the stage prior to formation into separate units.

First Embodiment

Figure 1B:
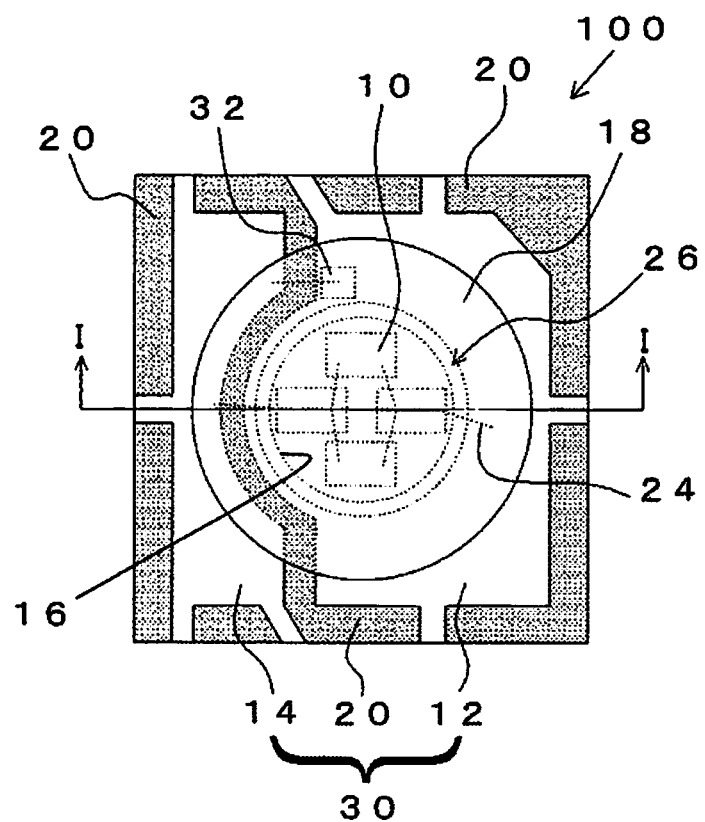
FIG. 1B is a schematic plan view of the light emitting device illustrated in FIG. 1A.

The light emitting device 100 according to the first embodiment of the present invention is shown in sectional view in FIG. 1A. FIG. 1B is a schematic plan view illustrating the light emitting device 100, and FIG. 1A is a schematic sectional view along the line I-I of a lead frame illustrated in FIG. 1B.

A light emitting device 100 principally includes a first lead 12, a second lead 14, an insulating member 20 configured to fix these leads, a light emitting element 10 mounted on the first lead 12, a wavelength conversion portion 16 configured to cover the light emitting element 10 and a lens portion 18 configured to cover the wavelength conversion portion 16.

The first lead 12 and the second lead 14 are integrally formed by the insulating member 20. That is to say, as illustrated in FIG. 1A, the first lead 12 and the second lead 14 are separated by an interval, and the insulating member 20 is embedded to fill that interval. The thickness of the first lead 12 and the second lead 14 is approximately equal to the thickness of the insulating member 20. The first lead 12, the second lead 14 and the insulating body 20 form a resin substrate 30. As illustrated in FIG. 1B, the resin substrate 30 has a tabular configuration, and the upper surface and the lower surface of the first lead 12 and the second lead 14 are exposed on its upper surface and lower surface. In other words, the upper surface and the lower surface of the first lead 12, the second lead 14 and the insulating member 20 are configured to be flush, respectively.

As illustrated in FIG. 1B, the first lead 12 is configured to project in a direction facing the second lead 14, and the second lead 14 has a depressed configuration with reference to the projection of the first lead 12. A projecting portion of the first lead 12 is formed in a curved shape that is concentric with the circle of a groove portion 26 along the shape of the groove portion 26 described below in approximately the center in a vertical direction. In this manner, the region in which the light emitting element 10 on the first lead 12 is mounted is configured to be substantially in the center of the light emitting device 100. That is to say, it is preferred that the first lead 12 projects to enable the positioning of the light emitting element 10 substantially in the center of the light emitting device 100.

The groove portion 26 to retain the wavelength conversion portion 16 in a specific region is formed in the first lead 12. The groove portion 26 has a circular shape when in a plan view as illustrated in FIG. 1B, and four light emitting elements 10 are disposed in the region surrounded by the groove portion 26. As illustrated in FIG. 1A, the first lead 12 has a thin configuration in the thickness direction for defining the groove portion 26. Therefore, the bottom face of the groove portion 26, i.e., an opening of the first lead 12 that forms the groove portion 26 is formed to be positioned below the surface that mounts the light emitting element 10.

As illustrated in FIG. 1A, the shape of the opening of the groove portion 26 preferably describes a right angle or acute angle between the surface on the inner side that forms the groove and the surface that mounts the light emitting element. Since the end portion of the wavelength conversion portion 16 is formed in the shape of the opening by a pin lock effect, the extent of the shape of the wavelength conversion portion 16 is defined, and a protruding shape of the wavelength conversion portion 16 exhibits a stable formation. The wavelength conversion portion 16 is formed as a hemisphere since the wavelength conversion portion 16 is configured in a protruding shape that projects from the light emitting element mounting surface, and therefore a light emitting device can be realized that exhibits a low variation in light distribution and chromaticity, and particularly superior light quality.

According to an embodiment of the present invention, variation in light quality can be suppressed, and superior illumination quality is obtained even when beam condensing is performed by use of a beam-condensing device.

That is to say, the embodiment of the present invention is completed in light of the problems below, the coverage of the sealing resin that includes the fluorescent material tends to be affected by the viscosity of the resin and the peripheral temperature, and therefore light quality can not exhibit stable characteristics. In other words, the region of disposition of the fluorescent material can not be stable. Consequently, the periphery of the light emitting element is illuminated with blue color and locations more removed from the light emitting element are illuminated with a yellow color, and it may results in the problem of a large variation in light quality. Furthermore, since the region of disposition of the fluorescent material is large, there may be the problem that there is a large difference in relation to chromaticity between the periphery of the light emitting element and the locations more removed from the light emitting element.

Figure 12A:
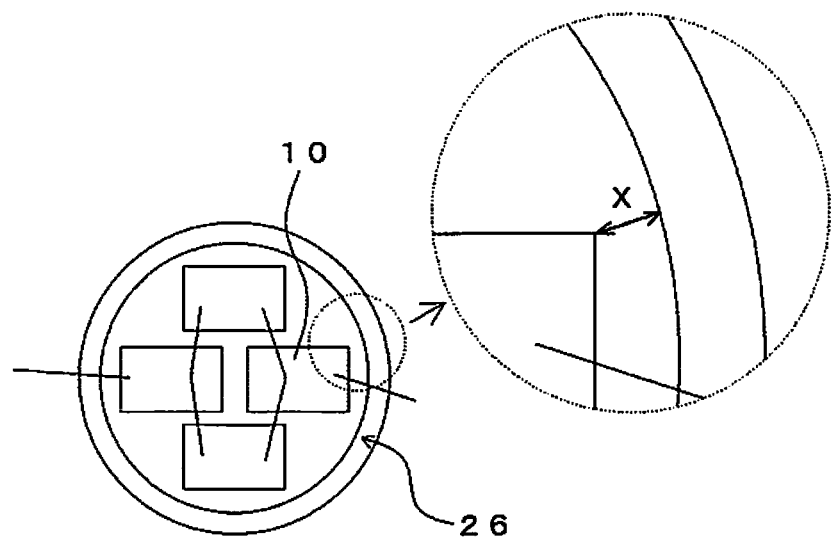
FIG. 12A is a schematic view illustrating an embodiment of a groove portion.

As illustrated in FIG. 12A, the distance X from the surface on the inner side that forms a groove of the groove portion 26 to the most proximate light emitting portion 10 is preferably at least 1 micron, and at least 5 microns is more preferred. When the distance X is small, it is not possible to insert a wavelength conversion material having a grain diameter that is larger than X into this region, and therefore, the content amount of the wavelength conversion material in the region is reduced which therefore results in failure to convert the light from the light emitting element 10 to a desired wavelength. Consequently, although it is preferred that the distance X is greater than the average grain diameter of the wavelength conversion material (fluorescent material) that is used, when light quality is taken into account, it is preferred that X is no more than 5 microns. It is known that the light extraction efficiency is enhanced when the grain diameter of the wavelength conversion unit is large, and therefore a configuration of 1 micron to 50 microns is suitable. More preferably, a configuration of 3 microns to 40 microns is preferred.

There is no particular limitation on the number and disposition of the light emitting elements 10, and one or a plurality may be provided. However, it is preferred that a balanced configuration is provided in relation to disposition with line symmetry or point symmetry on the region surrounded by the groove portion 26 in order to enhance the light quality. Herein, a plurality (four) light emitting elements is disposed. The surface of the light emitting elements 10 that is mounted on the first lead 12 exhibits insulating characteristics, and has positive electrode and negative electrode on an upper surface, that is to say, is configured as a face-up light emitting element. The positive electrode and negative electrode of the light emitting element 10 are electrically connected to the first lead 12 and the second lead 14 by wire 24, respectively.

The area of the lower surface of the light emitting element 10 that is in contact with the first lead 12 is preferably at least 10% of the surface area of the region forming the wavelength conversion portion 16 (surface area of the region surrounded by the groove portion 26), which is the upper surface of the first lead 12. When the surface area of the lower surface of the light emitting element 10 is less than 10%, the color tone at a location separated from the light emitting element and in proximity to the light emitting element undergoes a large variation. For example, when a fluorescent material that emits yellow light and a light emitting element that emits blue light are used, since there is a large amount of the fluorescent material at a position separated from the light emitting element, there is a greater tendency for a yellow color tone comparing to the proximity to the light emitting element. As a result, yellow ring phenomenon is conspicuous, the light distribution and chromaticity of the light emitting device is adversely affected, and the light quality is poor.

The wavelength conversion portion 16 contains a wavelength conversion material configured to convert the wavelength of light from the light emitting element 10, and is configured to cover the light emitting element 10. The lower surface of the wavelength conversion portion 16 is formed on the inner side of the region surrounded by the groove portion 26, a portion of the wire 24 is covered by the wavelength conversion portion 16, and the residual portion of the wire 24 is covered by a lens portion 18 provided on an outer side.

The wavelength conversion portion 16 is formed only on the first lead 12, and is not formed on the second lead 14 or the insulating member 20. That is to say, the insulating member 20 is not contacted with the wavelength conversion portion 16. In this manner, even in a configuration in which the insulating member 20 exhibits a low optical reflectance, since there is almost no effect on the light extraction efficiency, a cheap resin material can be used without considering the reflectance. Furthermore, since the light from the light emitting element is efficiently reflected by a metallic member such as the lead, the light extraction efficiency can be enhanced.

The lens portion 18 is formed to cover the wavelength conversion portion 16. In the present embodiment, the lower surface of the wavelength conversion portion 16 only comes into contact with the first lead 12, and from that position upwardly, a protruding lens portion 18 is configured to cover all the wavelength conversion portion 16. Herein, the shape of the lens is hemispherical.

Herein, the lower surface of the first lead 12 that forms the opposite side of the region formed on the wavelength conversion portion 16 (the portion shown by A in FIG. 1A) is not covered by the insulating member 20 and is exposed to the outside. In this manner, when mounting the light emitting device 100 on the mounting substrate, heat produced by the light emitting element 10 and the wavelength conversion portion 16 can be efficiently drew into the mounting substrate, and thereby enhance the light emission efficiency.

As described above, the light emitting device 100 can be realized that exhibits superior light quality and high light emission efficiency.

Detailed description of the constituent members of the light emitting device 100 will be given below.

First Lead 12, Second Lead 14

The first lead 12 and the second lead 14 for example is formed using a good electrical conductor such as iron, copper, phosphor bronze, copper alloys, Iron-based alloys such as alloy 42, or a clad member laminated using such materials. Processing by use of pressing, etching or a laser process is also possible. Furthermore, as required, metal plating may be performed on the surface. The plating material includes Ag, Ag alloys, Au, Au alloy, Cu, Ni, Pd or the like. The outermost surface of plating is preferably Ag, an Ag alloy, Au or an Au alloy. Ag, Ag alloys, Au, Au alloy, Cu, Ni, Pd and the like may be laminated as an underline.

The thicknesses of the first lead 12 and the second read 14 are preferably 50 to 1000 microns, respectively, and preferably 100 to 500 microns. The depth of the groove is preferably 10 to 80% of the thickness of the first lead 12. When the groove is excessively shallow, the wavelength conversion portion 16 leaks out and cannot be properly retained. When the groove is excessively deep, light entering the groove cannot come out again, and therefore light emission efficiency is poor.

The first lead 12 and the second lead 14 are preferably configured with an uneven structure in order to enhance the attachment characteristics with the insulating member 20. In this manner, the attachment surface area between the leads and the insulating member 20 is increased, and thereby attachment characteristics are enhanced. The uneven structure is preferably formed from the surface of the leads towards the side surface, and may be formed by etching or press processing.

Insulating Member 20

A resin can be employed suitable for the insulating member 20. Examples of such resin preferably include thermoplasticity resins containing at least one of an acrylate resin, an aromatic polyamide resin, a polyester resin, a liquid crystal resin, and thermosetting resins containing at least one of an epoxy resin, a modified epoxy resin, a phenolic resin, a silicone resin, a modified silicone resin, a hybrid resin, an urethane resin. An epoxy resin, a modified epoxy resin, a silicone resin, a modified silicone resin, a hybrid resin and the like are preferable.

The insulating member 20 may include at least one of a diffusion agent, a high thermal conductivity material, a reinforcing material, an antioxidant agent, an ultraviolet absorbing material, a light stabilizer, a lubricant and the like. Examples of the diffusion material include at least one titanium oxide, zirconium oxide, aluminum oxide, silicon oxide, boron oxide, hollow filler and the like. Examples of the reinforcing material include whiskers, glass fibers and the like.

Examples of the high thermal conductivity material include boron nitride, aluminum nitride, aluminum oxide and the like. Examples of the antioxidant include phenol-based, sulfur-based phosphorus-based, amine-based and other agents. Examples of the lubricant include a higher fatty acid ester, silicone-based, fluorine-based and other agents. Additives such as UV absorbers and light stabilizers may be included.

Wavelength Conversion Portion 16

The wavelength conversion portion 16 contains a wavelength conversion material in the resin material. Examples of the resin material include thermoplasticity resins containing at least one of an acrylate resin, an aromatic polyamide resin, a polyester resin, a liquid crystal resin, and thermosetting resins containing at least one of an epoxy resin, a modified epoxy resin, a phenolic resin, a silicone resin, a modified silicone resin, a hybrid resin, an urethane resin. An epoxy resin, a modified epoxy resin, a silicone resin, a modified silicone resin, a hybrid resin and the like are preferable.

The resin material may include a mixture of a diffusion agent or the like in order to maintain a predetermined function. Examples of the diffusing agent include at least one of titanium oxide, zirconium oxide, aluminum oxide, silicon oxide, boron oxide, hollow filler and the like. Further, the nano materials such as nano titanium oxide, nano-zirconium oxide, nano-aluminum oxide, nano-silicon oxide, nano-boron oxide and the like may be used. The average particle diameter is preferably 1 nm to 50 microns, and more preferably, 5 nm to 20 microns.

Wavelength Conversion Member

There is no particular limitation on the wavelength conversion member as long as the light emitted from the light emitting element is converted to the light having the desired wavelength. Examples of the wavelength conversion member include a YAG-based fluorescent material (yellow to green fluorescent material), LAG-based fluorescent material (yellow to green fluorescent material), oxy-nitride fluorescent material that is mainly activated by europium, cerium, and other such lanthanoid elements, nitride fluorescent material that is mainly activated by europium, cerium, and other such lanthanoid elements. Examples of europium-doped red fluorescent material include SCASN fluorescent material such as (Sr, Ca)AlSiN$_3$:Eu or the like, CASN fluorescent material such as CaAlSiN$_3$:Eu, SrAlSiN$_3$:Eu, or the like. Further chlorosilicate fluorescent materials, β sialon fluorescent materials or the like that emits green light and absorbs blue light emitted from light emitting element.

Lens Portion 18

A resin material is preferably used in the lens portion 18. Examples of the resin material include thermoplasticity resins containing at least one of an acrylic resin, a polycarbonate resin, an aromatic polyamide resin, a polyester resin, a liquid crystal resin, thermosetting resins containing at least one of an epoxy resin, a modified epoxy resin, a phenolic resin, a silicone resin, a modified silicone resin, a hybrid resin, an urethane resin, and inorganic materials such as at least one of a low-melting-point glass and water glass. An epoxy resin, a modified epoxy resin, a silicone resin, a modified silicone resin, a hybrid resin and the like are preferable, and a silicone resin, a modified silicone resin, a hybrid resin are more preferable.

The lens portion 18 may maintain a predetermined function by mixture of at least one substance selected from the group comprising of a diffusion agent and a high thermal conductivity material. Examples of the diffusing agent include titanium oxide, zirconium oxide, aluminum oxide, silicon oxide, boron oxide and the like. The average particle diameter is preferably 0.1 microns to 50 microns, and more preferably, 0.5 microns to 40 microns. Further, the nano materials such as nano titanium oxide, nano-zirconium oxide, nano-aluminum oxide, nano-silicon oxide, nano-boron oxide and the like may be used. The average particle diameter is preferably 1 nm to 100 nm, and more preferably, 5 nm to 90 nm. Examples of the high thermal conductivity materials may include aluminum oxide, boron nitride, nano diamond and the like. The wavelength conversion materials which absorb the light emitted from the light emitting element and converts the wavelength of the light can be contained in the lens portion 18.

The lens portion 18 preferably has the function of refracting, dispersing or focusing light, and in response to various purposes, the lens portion 18 may have various configurations such as a lens with a smaller curvature than a hemisphere, or a hemispherical shape, or a lens with a larger curvature than a hemisphere. A desired light distribution is obtained by the lens portion 18. On the other hand, when focusing light from the light emitting element 10 with the lens portion 18, there has been the problem that the color deviation in proximity to the light emitting element is accentuated through the mediation of the lens portion, and consequently the illumination light exhibits a color deviation (color shading) such as so-called yellow ring. In the present embodiment, since color deviations in proximity to the light emitting element can be suppressed, superior illumination quality as demanded by the market can be obtained even when focusing by use of the lens portion 18.

Light Emitting Element 10

The light emitting element 10 is preferably a light emitting diode. For example, it is possible to use a configuration having a light emission peak wavelength of 350 nm to 800 nm. In particular, when using a light emitting element configured from a nitride-based semiconductor, it is preferred to use a configuration having a light emission peak wavelength of 420 nm to 550 nm in the short wavelength region of visible light.

Other

The light emitting device 100 as illustrated in FIG. 1B further includes a protective element 32. The protective element is suitably configured as a Zener diode for example. The protective element 32 is preferably disposed in the outer region of the groove portion 26 mounted on the light emitting element 10. In this manner, absorption of light from the light emitting element 10 by the protective element 32 can be suppressed, and it is possible to suppress a reduction in the light extraction efficiency of the light emitting device 100. Furthermore, an effect on light distribution characteristics can be suppressed, and light quality enhanced.

Method of Manufacturing Light Emitting Device 100

Figure 3A:
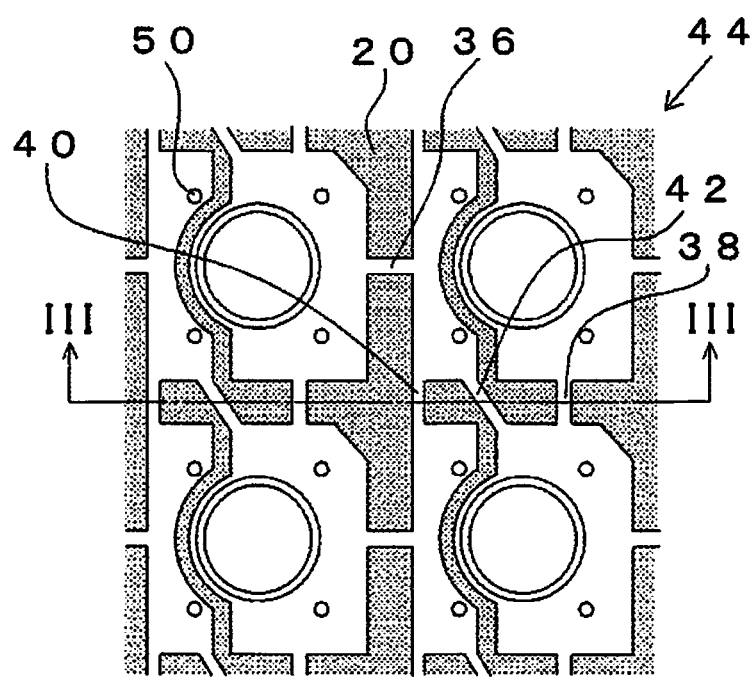
FIG. 3A is a schematic plan view illustrating a resin molded body according to the first embodiment of a light emitting device according to the present invention.
Figure 3B:
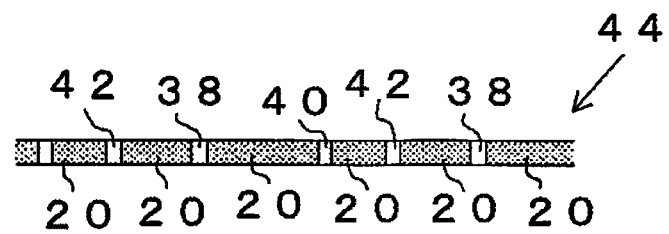
FIG. 3B is a schematic sectional view along the line Ill-III of a lead frame illustrated in FIG. 3A.
Figure 4A:
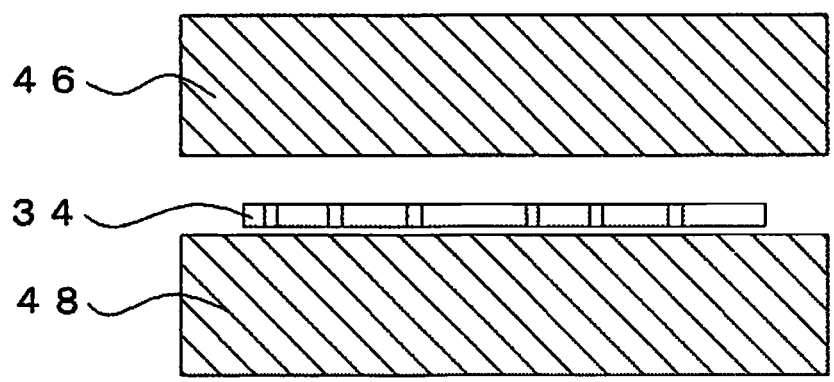
FIG. 4A and FIG. 4B illustrate a method of manufacturing the resin molded body according to the first embodiment of a light emitting device according to the present invention.
Figure 4B:
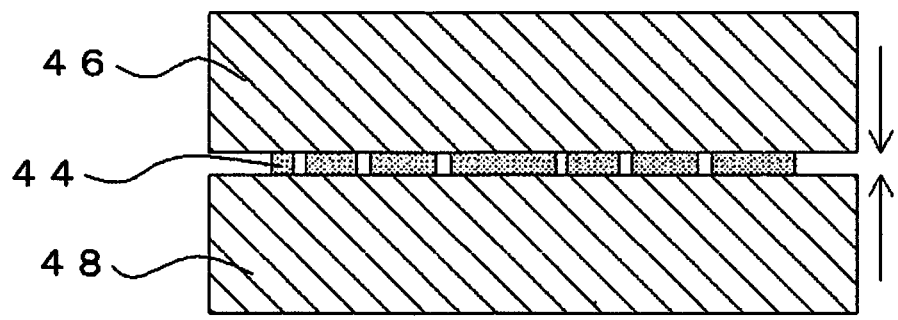

As illustrated in FIG. 4A, a first processing step comprises sandwiching of the lead frame 34 with an upper die 46 and lower die 48. Then as illustrated in FIG. 4B, the insulating member 20 is transfer molded into a die sandwiched by the upper die 46 and the lower die 48. Heat processing is executed in an oven to cure the resin and integrally form the insulating member 20 in the lead frame 34 and thereby form a resin molded body 44. The resin molded body 44 formed in the above manner is illustrated in FIG. 3.

The lead frame 34 is configured so that a plurality of first leads 12 and second leads 14 that form the light emitting device 100 are connected. As illustrated in FIG. 3A, thereafter, the portion forming the first lead 12 and the portion forming the second lead 14 may be connected in a horizontal direction by a suspension lead 36, and the vertically adjacent pairs of first leads 12 may be connected by a suspension lead 38. The vertically adjacent pairs of second leads 14 may be connected by a suspension lead 40. Furthermore, the pairs of vertically adjacent portions forming the first lead 12 and the vertically adjacent portions forming the second lead 14 may be connected to a suspension lead 42 that extends in an inclining direction. The suspension 42 may or may not be provided.

The method of molding is preferably transfer molding, but also includes injection molding, compression molding, and extrusion molding.

A hole 50 to enhance the attachment with the insulating member 20 is preferably provided on the lead frame 34. In this manner, detachment or peeling of the insulating member 20 from the lead frame 34 can be suppressed. A recessed portion may be formed in the lead frame 34 in order to enhance the attachment characteristics with the lens portion 18. The recessed portion is formed by half-etching the lead flame 34. The recessed portion 21a may have a circular shape, a band shape, a curved band shape, polygonal shape, or the like when viewed in plan.

Next, in a second processing step, electric deflash processing is perform to remove resin burrs on the resin molded body surface produced by transfer molding, and then the resin burrs are removed with a water jet. Electric deflash processing is a process by immersion of the resin molded body in a solution, execution of electrolysis in that state, and swelling of the thin resin pieces attached to the lead frame, that is to say, swelling of the burrs. Removal of resin burrs enhances the reliability of wire bonding, the mounting of the protective element, and the mounting of the light emitting element described hereafter. Removal of resin burrs may also be performed by chemical dip processing, blast processing or laser processing.

In a third processing step, a bonding material is coated onto the position for mounting of the light emitting element 10 being on the inner side of the groove portion 26 of the portion forming the first lead 12 to thereby mount the light emitting element 10. Next, heat processing is performed in an oven to cure the bonding material. Examples of the bonding material include thermosetting resins containing at least one of an epoxy resin, a modified epoxy resin, a phenolic resin, a silicone resin, a modified silicone resin, a hybrid resin, an urethane resin, and inorganic materials such as at least one of a low-melting-point glass, water glass and hydraulic cement. A modified epoxy resin, a silicone resin, a modified silicone resin, a hybrid resin and the like are preferable, and a silicone resin, a modified silicone resin, a hybrid resin are more preferable.

In a fourth processing step, a conductive bonding material is coated to the position of mounting of the protective element that is the outer side of the groove portion 26 of the first lead 12 to thereby mount the protective element. Next, heat processing is performed in an oven to cure the bonding material. The conductive bonding material is preferably configured for example as an Ag paste.

In a fifth processing step, the light emitting element 10 and the portions forming the first lead 12 and forming the second lead 14, respectively, and the portion forming the second lead 14 and the protective element 32 are respective electrically connected by the wires 24 by use of a wire bonding apparatus.

In a sixth processing step, resin that includes the wavelength conversion material is coated from above the light emitting element 10 using a resin coating apparatus, and then subjected to thermal processing in an oven to cure the resin.

The wavelength conversion portion 16 is configured with a protruding shape by a pin lock effect from the groove portion 26.

In a seventh processing step, the resin molded body obtained in the sixth step is placed in a heated lower die, coating with the resin for formation of the lens portion 18, and then, the resin molded body is sandwiched with the die, and a resin molded body is removed that includes formation of a protruding lens portion 18. Thermal processing in an oven is performed to cure the lens portion 18.

Figure 13:
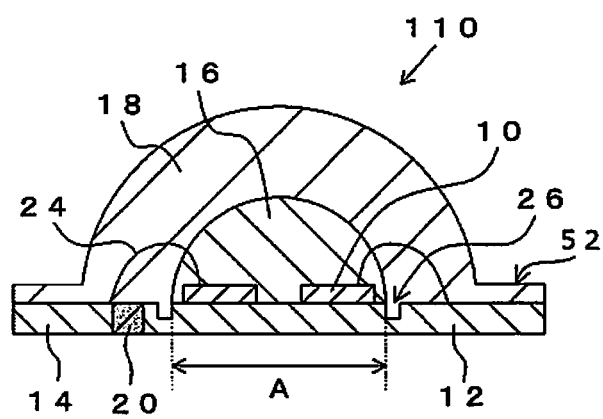
FIG. 13 is a schematic sectional view illustrating an embodiment of a light emitting device according to the present invention.

The method of forming the lens portion 18 includes use of various methods such as transfer molding, compression molding, resin coating (potting), molding by use of a casting case, or the like. When molding by use of compression molding, a flat portion 52 is formed in the periphery of the lens portion 18 as illustrated in FIG. 13 as a light emitting device 110. The light emitting device according to the embodiment configures the resin molded body 44 substantially with the thickness of the lead frame, and therefore enables extremely thin molding in comparison to a conventional light emitting device. Therefore, the provision of the flat portion 52 in the lens portion 18 enables a configuration of a light emitting device with sufficient strength even when the thickness of the resin molded body is low.

Finally, in an eighth processing step, the resin substrate obtained in the seventh step is adhered to the dicing sheet, and the insulating member 20 is cut with a dicing blade through the suspension leads 36, 38, 40, and 42 to thereby obtained individual light emitting devices 100.

Second Embodiment

Figure 2A:
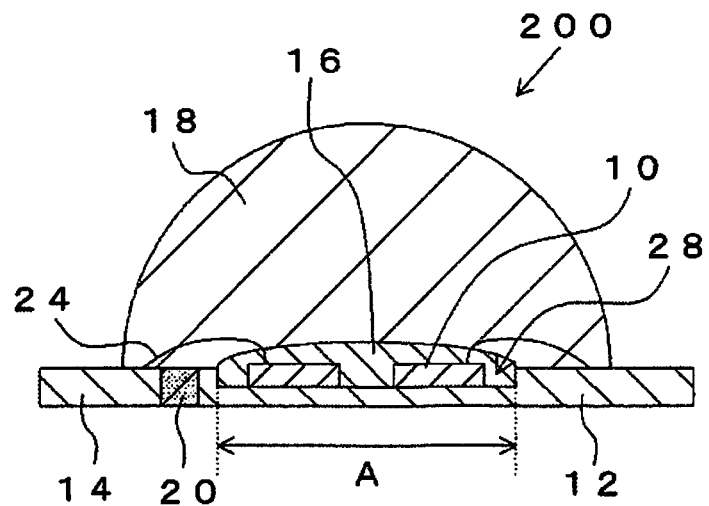
FIG. 2A is a schematic sectional view illustrating a second embodiment of a light emitting device according to the present invention.
Figure 2B:
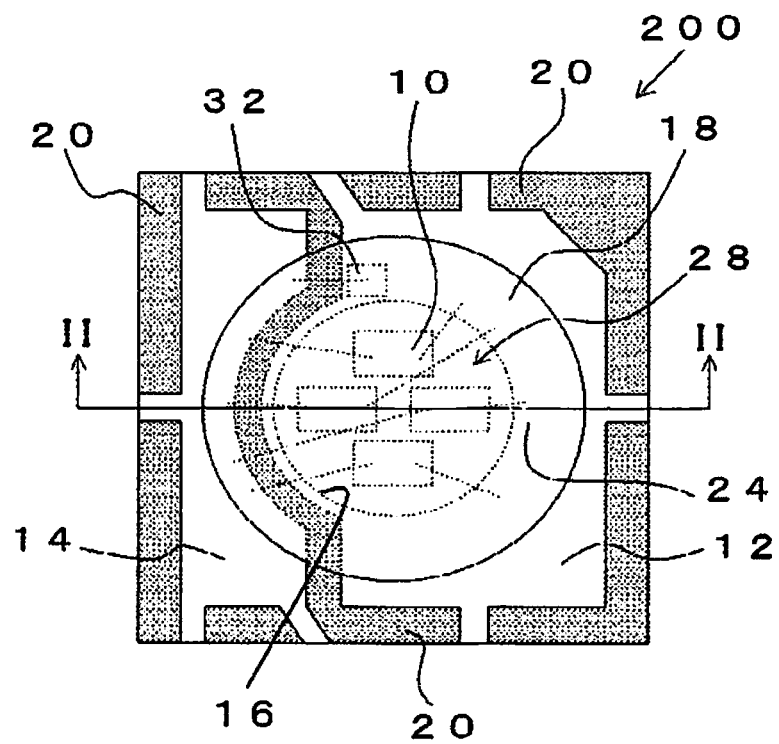
FIG. 2B is a schematic plan view of the light emitting device illustrated in FIG. 2A.

The light emitting device 200 according to the second embodiment of the present invention is shown in sectional view in FIG. 2A. FIG. 2B is a schematic plan view illustrating the light emitting device 200, and FIG. 2A is a schematic sectional view along the line I-I of a lead frame illustrated in FIG. 2B.

A light emitting device 200 differs from the first embodiment in relation to the point that a recessed portion 28 is provided in substitution for the groove portion in the first lead 12. In other respects, the second embodiment is substantially the same to the first embodiment.

The recessed portion 28 is formed in the first lead 12 in order to retain the wavelength conversion portion 16 in a specific region. In the present embodiment, as illustrated in FIG. 2B, the recessed portion 28 has a circular shape when viewed in plan. Four light emitting elements 10 are disposed on the recessed portion 28. As illustrated in FIG. 2A, the recessed portion 28 is formed by reducing the thickness of a portion of the first lead 12. That is to say, the bottom surface of the recessed portion that mounts the light emitting element 10 is positioned below the upper surface of the insulating member 20.

The depth of the recessed portion 28 is preferably 5 to 70% relative to the thickness of the first lead 12. When the depth of the recessed portion is excessively shallow, the wavelength conversion portion 16 leaks out and cannot be properly retained. When the recessed portion is excessively deep, light leaving the light emitting element and the wavelength conversion portion is retained in the recessed portion, and therefore light extraction efficiency is poor.

The wavelength conversion portion 16 is formed to fill the recessed portion 28. The wavelength conversion portion 16 may be formed in a protruding configuration as illustrated in FIG. 2A, may be formed in a recessed configuration, or may have a flat upper surface. Furthermore, the upper surface of the wavelength conversion portion 16 may be positioned more on an upper side than the surface of the first lead 12, the second lead 14 and the insulating member 20, or may be positioned on a lower side.

The method of manufacturing the light emitting device 200 according to the second embodiment may be the same as the method of manufacturing the light emitting device 100 according to the first embodiment by use of a lead frame forming a recessed portion in substitution for the groove portion.

The light emitting device 200 can be realized that exhibits superior light quality and high light emission efficiency. Further, since a large amount of light is emitted from the opening of the recessed portion toward the upper surface due to the enablement of light reflection in the recessed portion 28, the light emitting surface area can be reduced and thereby obtain well-defined light quality.

Figure 12B:
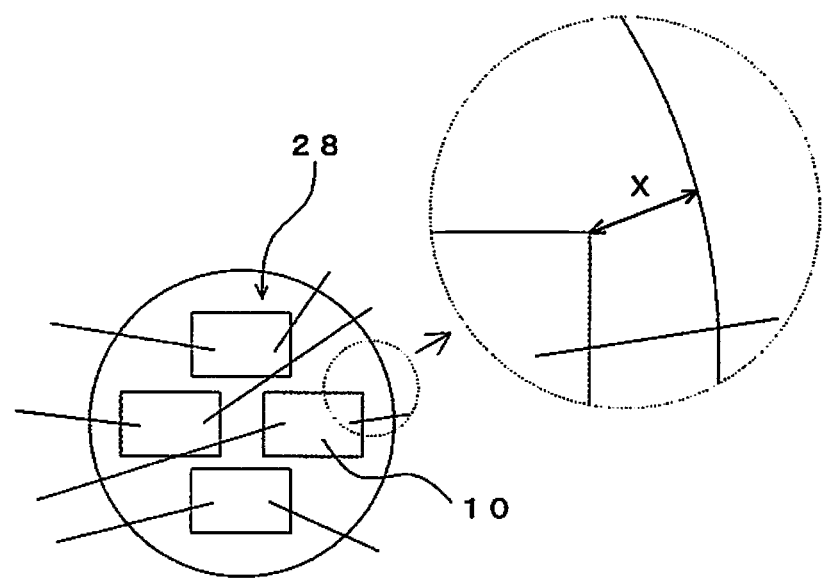
FIG. 12B is a schematic view illustrating an embodiment of a recessed portion of a light emitting device according to the present invention.

As illustrated in FIG. 12B, the distance X from the surface on the inner side that forms a groove of the recessed portion 28 to the most proximate light emitting portion 10 is preferably at least 1 micron, and at least 5 microns is more preferred. When light quality is taken into account, it is preferred that X is no more than 5 microns. This point is the same in relation to the first embodiment.

Third Embodiment

Figure 5:
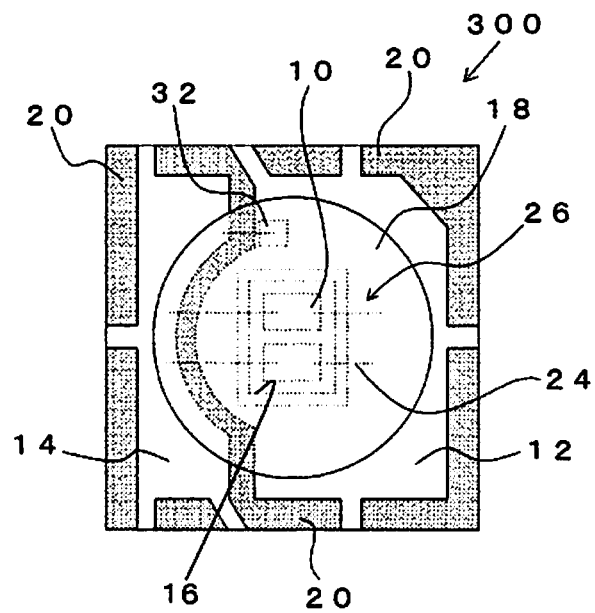
FIG. 5 is a schematic sectional view illustrating a third embodiment of a light emitting device according to the present invention.

The light emitting device 300 according to the third embodiment of the present invention is shown in plan view in FIG. 5.

The light emitting device 300 differs from the first embodiment in relation to the point that the groove portion 26 is formed as a rectangle when viewed in plan, and two light emitting elements 10 are disposed in the groove portion 26. In other respects, the third embodiment is substantially the same to the first embodiment. According to the present embodiment, the bottom surface of the wavelength conversion portion 16 is formed along the outer contour of the light emitting element 10. In this manner, since the light conversion portion 16 is configured with a uniform shape along the light emitting element 10 outer periphery in proximity to the light emitting element 10, the difference in the chromaticity of the end portions of the light conversion portion 16, and the chromaticity in proximity to the light emitting element 10 can be reduced and therefore superior light quality is obtained.

The third embodiment obtains the same effect as the first embodiment.

Fourth Embodiment

Figure 6:
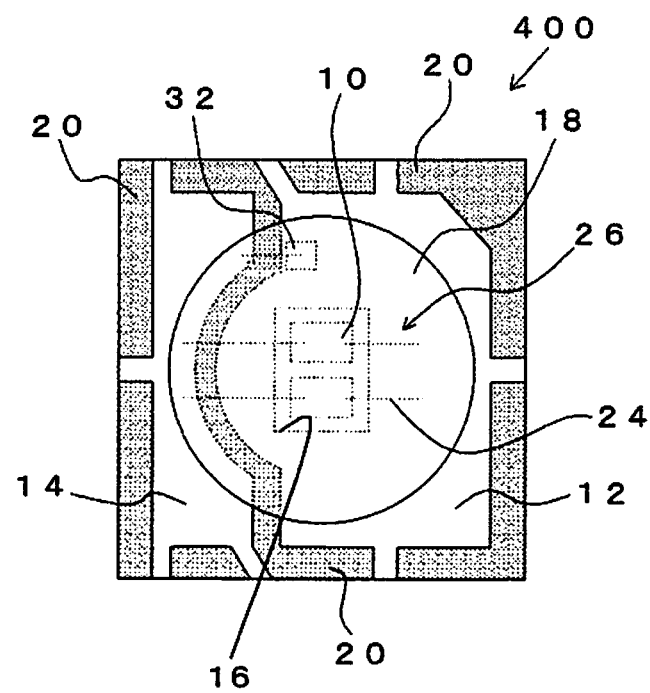
FIG. 6 is a schematic sectional view illustrating a fourth embodiment of a light emitting device according to the present invention.

The light emitting device 400 according to the fourth embodiment of the present invention is shown in plan view in FIG. 6.

The light emitting device 400 according to the fourth embodiment of the present invention is shown in plan view in FIG. 6. The light emitting device 400 differs from the second embodiment in relation to the point that the recessed portion 28 is formed as a rectangle when viewed in plan. In other respects, the second embodiment is substantially the same to the first embodiment.

Since the wavelength conversion portion 16 is formed in proximity to the light emitting element 10 as a result of forming the wavelength conversion portion 16 in proximity to the light emitting element 10, the difference in the chromaticity of the end portions of the light conversion portion, and the chromaticity in proximity to the light emitting element can be reduced and a large amount of light is emitted from the opening of the recessed portion towards the upper surface. Therefore, the light emission surface area can be reduced and well-defined light quality is obtained.

The forth embodiment obtains the same effect as the second embodiment.

Fifth Embodiment

Figure 7:
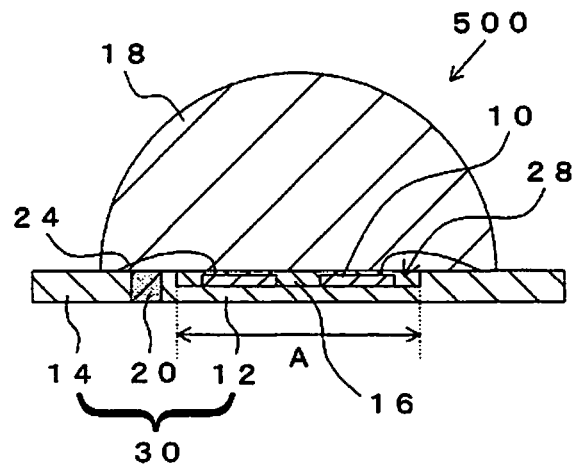
FIG. 7 is a schematic sectional view illustrating a fifth embodiment of a light emitting device according to the present invention.

The light emitting device 500 according to the fifth embodiment of the present invention is shown in plan view in FIG. 7.

The light emitting device 500 differs from the second embodiment in relation to the point that the upper surface of the light emitting element 10 may be positioned more on a lower side than the upper surface of the first lead 12. In other respects, the fifth embodiment is substantially the same to the second embodiment.

The light emitting device 500 facilitates a uniform dispersal of the wavelength conversion material in the wavelength conversion portion 16 on the upper surface of the light emitting element 10 by formation of the upper surface of the light emitting element 10 on a lower side below the upper surface of the first lead 12, and thereby enhances light extraction efficiency and obtains superior light quality.

The fifth embodiment obtains the same effect as the second embodiment.

Sixth Embodiment

Figure 8:
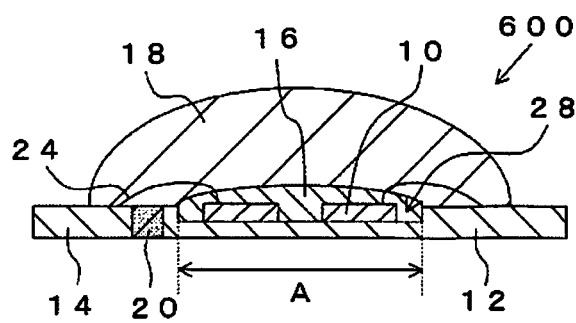
FIG. 8 is a schematic sectional view illustrating a sixth embodiment of a light emitting device according to the present invention.

The light emitting device 600 according to the sixth embodiment of the present invention is shown in plan view in FIG. 8.

The light emitting device 600 differs from the second embodiment in relation to the point that formation of the lens portion 18 with a lower curvature than the curvature in the second embodiment, and enables extraction of a broader distribution of light. In other respects, the sixth embodiment is substantially the same to the second embodiment.

The sixth embodiment obtains the same effect as the second embodiment.

Seventh Embodiment

Figure 9:
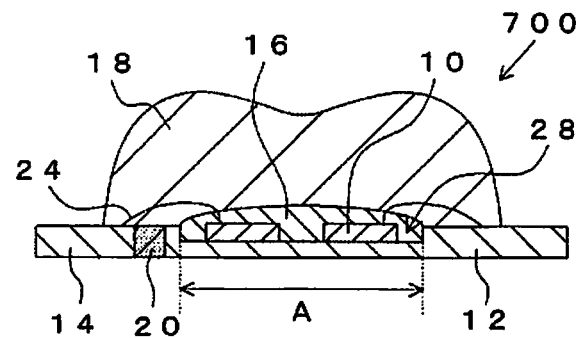
FIG. 9 is a schematic sectional view illustrating a seventh embodiment of a light emitting device according to the present invention.

The light emitting device 700 according to the seventh embodiment of the present invention is shown in plan view in FIG. 9.

The light emitting device 700 forms the lens portion 18 with two protrusions when viewed in sectional shape, and forms the central portion in a recessed configuration. This lens configuration enables a so-called batwing light distribution, and enables extraction of light in a broader light distribution than the second embodiment. In other respects, the seventh embodiment is substantially the same to the second embodiment.

The seventh embodiment obtains the same effect as the second embodiment.

Eighth Embodiment

Figure 10:
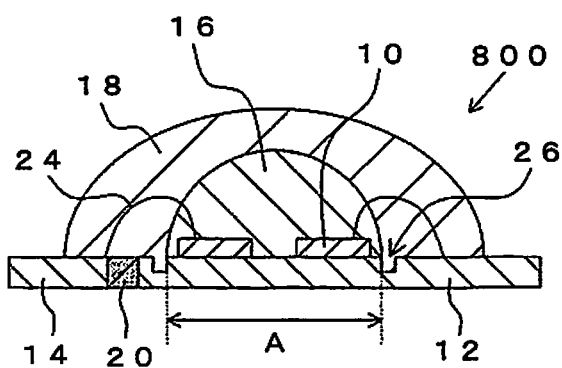
FIG. 10 is a schematic sectional view illustrating an eighth embodiment of a light emitting device according to the present invention.

The light emitting device 800 according to the eighth embodiment of the present invention is shown in plan view in FIG. 10.

The light emitting device 800 differs from the first embodiment in relation to the point that formation of the lens portion 18 with a lower curvature than the curvature in the second embodiment, and enables extraction of a broader distribution of light. In other respects, the sixth embodiment is substantially the same to the first embodiment. In other respects, the seventh embodiment is substantially the same to the second embodiment.

The eighth embodiment obtains the same effect as the first embodiment.

Ninth Embodiment

Figure 11:
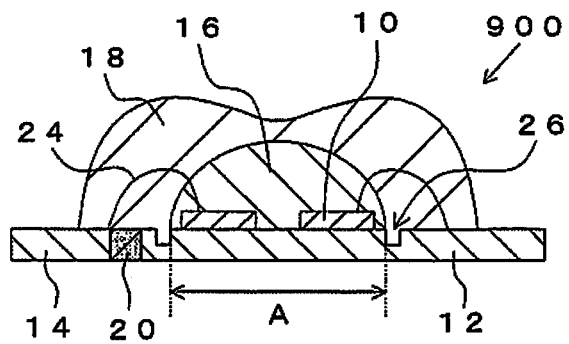
FIG. 11 is a schematic sectional view illustrating a ninth embodiment of a light emitting device according to the present invention.

The light emitting device 900 according to the ninth embodiment of the present invention is shown in plan view in FIG. 11.

The light emitting device 900 forms the lens portion 18 with two protrusions when viewed in sectional shape, and forms the central portion in a recessed configuration. This lens configuration enables a so-called batwing light distribution, and enables extraction of light in a broader light distribution than the first embodiment. In other respects, the seventh embodiment is substantially the same to the first embodiment.

The ninth embodiment obtains the same effect as the first embodiment.

Tenth Embodiment

Figure 14A:
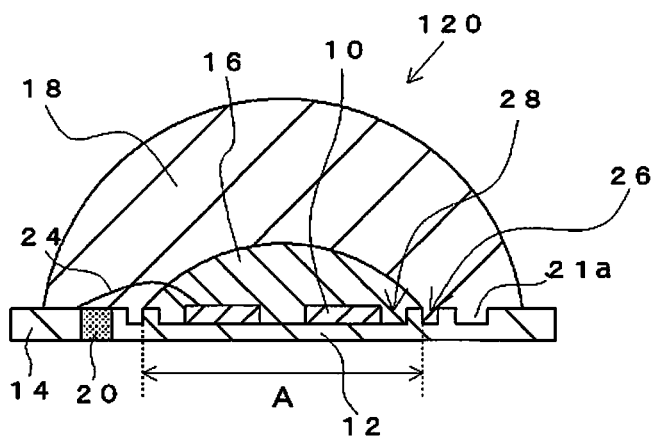
FIG. 14A is a schematic sectional view illustrating a tenth embodiment of a light emitting device according to the present invention.
Figure 14B:
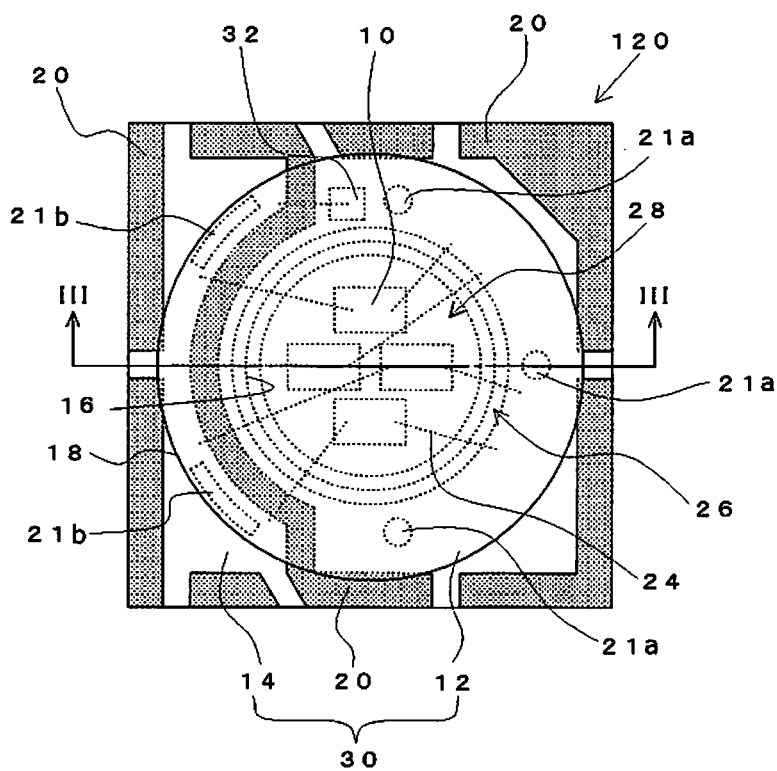
FIG. 14B is a schematic plan view of the light emitting device illustrated in FIG. 14A.

The light emitting device 120 according to the tenth embodiment of the present invention is shown in sectional view in FIG. 14A. FIG. 14B is a schematic plan view illustrating the light emitting device 120, and FIG. 14A is a schematic sectional view along the line III-III of a lead frame illustrated in FIG. 14B.

In the light emitting device 120, a recessed portion 28 is provided in the first lead 12, the recessed portion 28 has a circular shape when viewed in plan. Four light emitting elements 10 are disposed in the bottom region of the recessed portion 28. As illustrated in FIG. 14B, the recessed portion 28 is formed by reducing the thickness of a portion of the first lead 12. The recessed portion 28 is the same construction as that of the second embodiment.

The light emitting device 120 differs from the foregoing embodiments in relation to the point that the groove portion 26 is further formed. The groove portion 26 is formed outside of the recessed portion 28 and away from the recessed portion 28 on the first lead 12 formed of the recessed portion 28. The groove portion 26 is the same construction as that of the first embodiment.

The wavelength conversion portion 16 is formed to fill the recessed portion 28 so as to cover the light emitting elements 10. The wavelength conversion portion 16 is stably configured such that the end portion of the wavelength conversion portion 16 is positioned in the upper part of the inner surface of the groove portion 26 by a pin lock effect from the surfaces formed of the inner surface of the groove portion 26 and the upper face of the first lead 12. Therefore, the height of the protruding shape can be higher than a protruding shape of the wavelength conversion portion which is formed by only the recessed portion. The light emitting element positioned in the vicinity of the outside of the recessed portion can be covered by sufficient quantities of the wavelength conversion portion 16. Consequently, the color shading can be further improved.

Second Groove Portion or Recessed Portion

Figure 14C:
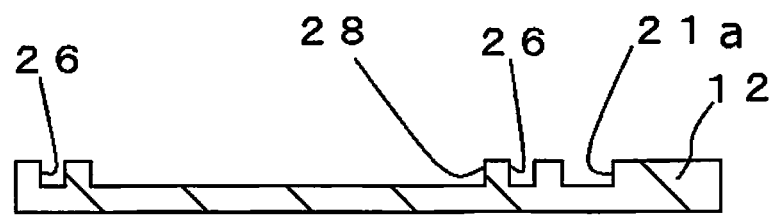
FIGS. 14C to 14F are schematic sectional views illustrating modifying embodiments of the first leads of a light emitting device according to the present invention.
Figure 14D:
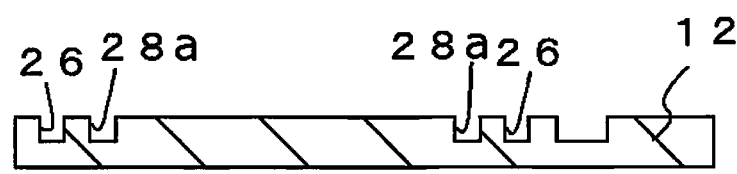
Figure 14E:
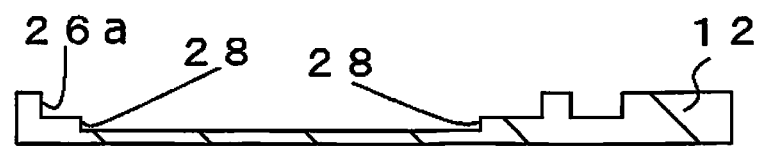
Figure 14F:
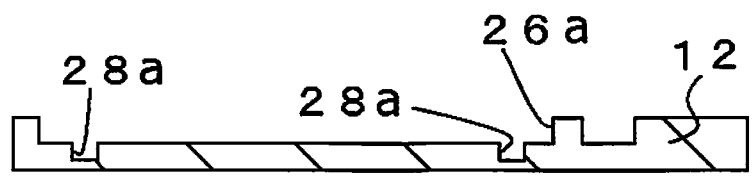

A second groove portion or recessed portion may be formed in the first lead 12 inside or outside of the groove portion or the recessed portion to retain the wavelength conversion portion 16 or the like in a specific area in the same matter of the groove portion or the recessed portion. As illustrated in FIG. 14C, the grove portion 26 is formed as the second groove portion outside of the recessed portion 28 in FIGS. 14A and 14B. Also, the first lead 12 may has a groove portion 26 as a second groove portion outside of the recessed portion 28*s* as illustrated in FIG. 14D, a recessed portion 26*a* as a second recessed portion outside of the recessed portion 28 as illustrated in FIG. 14E, a recessed portion 26*a* as a second recessed portion outside of the groove portion 28*a* as illustrated in FIG. 14F. The wavelength conversion portion 16, lens portion 14 or a diffusing agent-containing portion described below can be filled in the second groove portion or recessed portion.

Recessed portions 21*a* are formed in the first lead 12 in order to enhance the attachment characteristics with the lens portion 18. The recessed portion 21*a* has a circular shape when viewed in plan. Similarly recessed portions 21*b* are formed in the second lead 14 and have a curved band shape when viewed in plan. These recessed portions 21*a*, 21*b* are formed by half-etching the first lead 12 and the second lead 14.

Eleventh Embodiment

Figure 15:
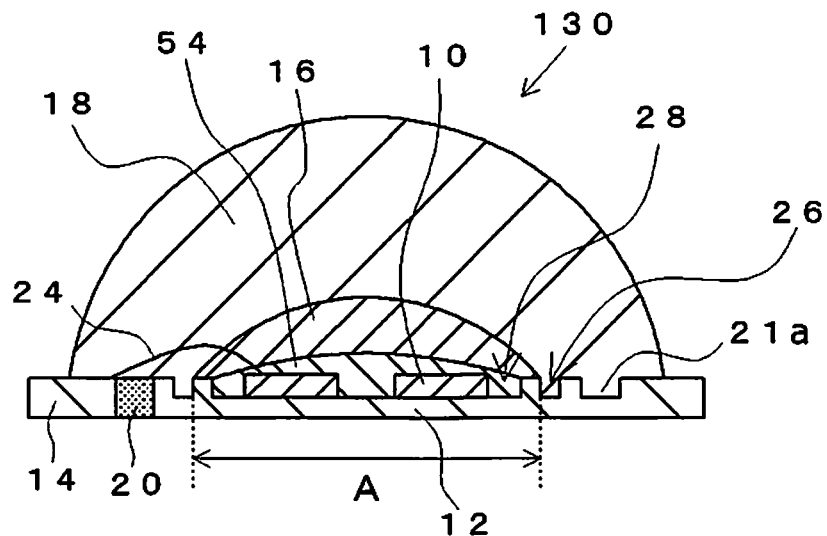
FIG. 15 is a schematic sectional view illustrating a eleventh embodiment of a light emitting device according to the present invention.

The light emitting device 130 according to the eleventh embodiment of the present invention is shown in sectional view in FIG. 15.

The light emitting device 130 differs from the tenth embodiment in relation to the point that the diffusing agent-containing portion 54 is formed to fill the recessed portion 28 in the same manner of the second embodiment, and the wavelength conversion portion 16 is formed in a protruding configuration on the diffusing agent-containing portion 54 so as to cover the diffusing agent-containing portion 54 by a pin lock effect from the groove 26, thus, two layers are positioned on the recessed portion 28. In other respects, the eleventh embodiment is substantially the same to the tenth embodiment. Covering a plurality of the light emitting elements 10 by the diffusing agent-containing portion 54 can create a state in which the whole diffusing agent-containing portion 54 radiates lump of light. Consequently, the color shading can be inhibited by formation of the wavelength conversion portion 16 on the diffusing agent-containing portion 54.

Diffusing Agent-Containing Portion 54

The diffusing agent which is contained in the wavelength conversion portion 16 can be positioned as a diffusing agent-containing portion 54 independently from the wavelength conversion portion 16 containing the wavelength conversion member described above. The diffusing agent-containing portion 54 can be formed from at least one diffusing agent and at least one resin material. The same resin material as that of the wavelength conversion portion can be preferably used, and the same diffusing agent as that of the wavelength conversion portion can be preferably used. The resin material of the wavelength conversion portion and the resin material of the diffusing agent-containing portion may be the same or different to each other. Also, the diffusing agent of the wavelength conversion portion and the diffusing agent of the diffusing agent-containing portion may be the same or different to each other.

Twelfth Embodiment

Figure 16:
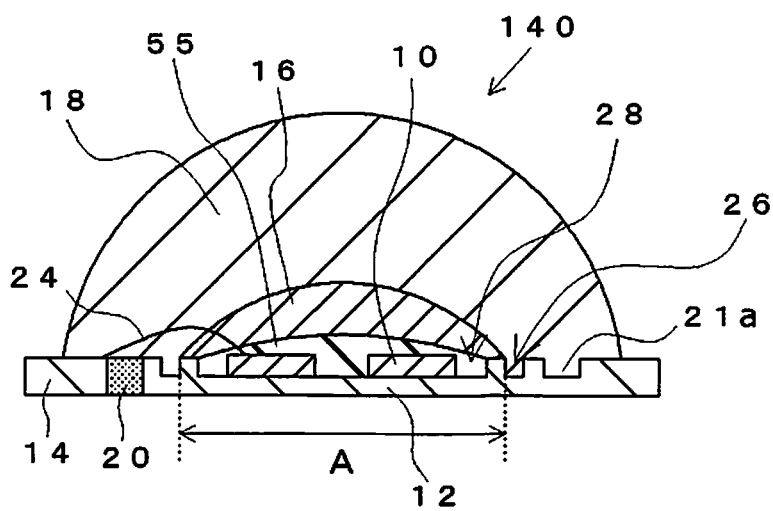
FIG. 16 is a schematic sectional view illustrating a twelfth embodiment of a light emitting device according to the present invention.

The light emitting device 140 according to the twelfth embodiment of the present invention is shown in sectional view in FIG. 16.

The light emitting device 140 differs from the tenth embodiment in relation to the point that a resin portion 55 which does not contain the diffusing agent, in stead of the diffusing agent-containing portion 54, is formed to fill the recessed portion 28 in the same manner of the second embodiment, and the wavelength conversion portion 16 is formed in a protruding configuration on the resin portion 55 so as to cover the resin portion 55 by a pin lock effect from the groove 26, thus, two layers are positioned on the recessed portion 28. In other respects, the twelfth embodiment is substantially the same to the tenth and the eleventh embodiment. Covering the light emitting elements 10 by the resin portion 55 which does not contain the diffusing agent can effectively reflect light emitted from the light emitting element 10 at the interface of the resin portion 55 and the wavelength conversion portion 16. Further, the reflected light can be reflected again at the surface of the first lead 12 in which the light emitting element is not insulated. As a result, the light extraction efficiency can be enhanced. Moreover, there may be no material which blocks and/or absorbs the light, thus the light emitted form the light emitting element and reflected light described above can travel within the whole resin portion 55. Consequently, the color shading can be inhibited.

Resin Portion 55

The resin portion 55 can be disposed under the wavelength conversion portion 16, in stead of or with the diffusing agent-containing portion 54. The resin portion 55 can be formed from at least one resin material. The same resin material as that of the wavelength conversion portion 16 and/or the diffusing agent-containing portion 54 can be preferably used. The resin material of the resin portion 55, the resin material of the wavelength conversion portion and the resin material of the diffusing agent-containing portion may be the same or different to each other.

The light emitting device according to the present invention can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

As illustrated above, embodiments are described to give a concrete form to technical ideas of a method of manufacturing light emitting element according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A light emitting device comprising:
a first lead on which is mounted a light emitting element;
a second lead separated by an interval from the first lead;
an insulating member configured to fix the first lead and the second lead;
a diffusing agent-containing portion configured to cover the light emitting element;
a wavelength conversion portion configured to cover the diffusing agent-containing portion; and
a lens portion configured to cover the wavelength conversion portion, wherein
a thickness of the insulating member is equal to the thickness of the first lead and the second lead,
a groove or a recessed portion provided to retain the wavelength conversion portion in a specific region formed in the first lead, and
a second groove portion or recessed portion formed in a first lead inner side of the groove portion or the recessed portion, which is filled with the diffusing agent-containing portion.

2. The light emitting device according to claim 1, wherein a lower surface of the first lead that forms an opposite side of a region formed on the wavelength conversion portion and the diffusing agent-containing portion is not covered by the insulating member and is exposed to the outside.

3. The light emitting device according to claim 1, wherein the insulating member is not in contact with the wavelength conversion portion.

4. The light emitting device according to claim 1, wherein the light emitting element is electrically connected to the second lead by wire, and the wire is covered by the wavelength conversion portion and lens.

5. The light emitting device according to claim 1, wherein the area of the lower surface of the light emitting element that is in contact with the first lead is at least 10% of the area of the region forming the wavelength conversion portion, which is the upper surface of the first lead.

6. The light emitting device according to claim 1, wherein the first lead is configured to project in a direction facing the second lead, and the second lead has a depressed configuration with reference to the projection of the first lead.

7. The light emitting device according to claim 1, wherein a plurality light emitting elements is disposed.

* * * * *